(12) United States Patent
Acker

(10) Patent No.: US 10,181,971 B2
(45) Date of Patent: Jan. 15, 2019

(54) SENSOR ARRANGEMENT WITH VARIABLE CARRIER FREQUENCY AND GOERTZEL FILTERING

(71) Applicant: Continental Teves AG & Co. oHG, Frankfurt (DE)

(72) Inventor: Heinrich Acker, Schwalbach (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 0 days.

(21) Appl. No.: 15/313,241

(22) PCT Filed: May 20, 2015

(86) PCT No.: PCT/EP2015/061183
§ 371 (c)(1),
(2) Date: Nov. 22, 2016

(87) PCT Pub. No.: WO2015/181031
PCT Pub. Date: Dec. 3, 2015

(65) Prior Publication Data
US 2017/0187556 A1    Jun. 29, 2017

(30) Foreign Application Priority Data

May 26, 2014    (DE) .................. 10 2014 210 009

(51) Int. Cl.
*H04L 27/06* (2006.01)
*G06F 17/24* (2006.01)
(Continued)

(52) U.S. Cl.
CPC .............. *H04L 27/06* (2013.01); *G01D 3/02* (2013.01); *G01R 23/16* (2013.01); *G06F 17/14* (2013.01);
(Continued)

(58) Field of Classification Search
CPC ..... H04L 27/02; H04L 27/06; H04L 27/2649; H04L 27/2639; H04L 25/06; H04B 1/30; G06F 17/14; G01R 23/16; G01D 3/02
See application file for complete search history.

(56) References Cited

U.S. PATENT DOCUMENTS 5,818,296 A     10/1998  Lee et al.
6,249,457 B1 *  6/2001   Okamoto ............... G11C 29/50
                                              365/185.09
(Continued)

FOREIGN PATENT DOCUMENTS

| CN | 103685860 A | 3/2014 | |
| DE | 102013000312 A1 | 7/2014 | |
| WO | WO 2013034739 A1 * | 3/2013 | ........... G01D 5/2266 |

OTHER PUBLICATIONS

Shevchenko et al., "Polyphase Sliding Goertzel Demodulator for Continuous Phase Frequency Modulated Signals," in IEEE Transactions on Applied Superconductivity, vol. 19, No. 3, pp. 570-573, Jun. 2009.*

(Continued)

*Primary Examiner* — Michelle M Koeth

(57) ABSTRACT

A method for processing a signal modulated with a variable carrier frequency includes calculating a coefficient for demodulation of the signal. The method also includes demodulating the signal by calculating discrete intermediate values utilizing the coefficient for a predefined maximum number of steps and calculating the signal with the aid of the intermediate values of the coefficient. The value of the coefficient is respectively calculated on the basis of carrier frequencies for each step.

11 Claims, 3 Drawing Sheets

(51) Int. Cl.
*H04L 27/26* (2006.01)
*G06F 17/14* (2006.01)
*H04L 25/06* (2006.01)
*H04L 27/02* (2006.01)
*G01R 23/16* (2006.01)
*G01D 3/02* (2006.01)
*H04B 1/30* (2006.01)

(52) U.S. Cl.
CPC .............. *H04L 25/06* (2013.01); *H04L 27/02* (2013.01); *H04L 27/2649* (2013.01); *H04B 1/30* (2013.01); *H04L 27/2639* (2013.01)

(56) References Cited

U.S. PATENT DOCUMENTS

| | | | |
|---|---|---|---|
| 9,759,751 B1* | 9/2017 | Sethi | G01R 21/133 |
| 2012/0066231 A1* | 3/2012 | Petersen | G06F 17/30867 |
| | | | 707/748 |
| 2012/0093264 A1 | 4/2012 | Yamaguchi | |
| 2012/0134238 A1 | 5/2012 | Surprenant et al. | |
| 2012/0221252 A1 | 8/2012 | Heinz et al. | |
| 2013/0141983 A1* | 6/2013 | Ruths | G11C 16/20 |
| | | | 365/185.21 |
| 2013/0259173 A1* | 10/2013 | Varanese | H04L 1/0001 |
| | | | 375/346 |
| 2014/0192933 A1* | 7/2014 | Pook | H04L 27/148 |
| | | | 375/324 |
| 2014/0203801 A1* | 7/2014 | Lehmann | G01D 5/2266 |
| | | | 324/207.17 |

OTHER PUBLICATIONS

Teh et al., "Partial-band jammer suppression in FFH spread-spectrum system using FFT," in IEEE Transactions on Vehicular Technology, vol. 48, No. 2, pp. 478-486, Mar. 1999.*
Hwang et al., "Efficient Recursive IDFT Scheme for Complex-valued Signals in Tap-selective Maximum-likelihood Channel Estimation," J Sign Process Syst, vol. 60, p. 71-80, Springer, 2010.*
German Search Report dated Oct. 9, 2014 for corresponding German application No. 10 2014 210 009.7.
International Search Report and Written Opinion dated Sep. 22, 2015 from corresponding International Patent Application No. PCT/EP2015/061183.
Goertzel, G., "An Algorithm for the Evaluation of Finite Trigonometric Series", The American Mathematical Monthly, Jan. 1958, pp. 34-35, vol. 65, No. 1. Mathematical Association of America. http://www.jstor.org/stable/2310304.
Chen, Chiouguey J., "Modified Goertzel Algorithm in DTMF Detection Using the TMS320C80" Texas Instruments, Application Report, Jun. 1996, pp. 1-12, Texas Instruments Incorporated.
Chinese Office Action dated Jul. 17, 2018 for corresponding Chinese Patent Application No. 201580025716.X.

* cited by examiner

SENSOR ARRANGEMENT WITH VARIABLE CARRIER FREQUENCY AND GOERTZEL FILTERING

TECHNICAL FIELD

The invention relates to a method, a signal processing unit for processing a signal modulated with a variable carrier frequency, as well as to a sensor arrangement having a signal processing unit according to the invention.

BACKGROUND

In order to measure sensor signals which are based on a variable quantity, it is known to modulate the signals by means of an amplitude modulation. It is furthermore known to carry out the implementation of an amplitude modulation in simple sensors with a restricted computing capacity in digital or discrete form. One demodulation algorithm known for this is, for example, the Goertzel algorithm, see *The American Mathematical Monthly*, Vol. 65, No. 1 (January, 1958), pp. 34-35, "An Algorithm for the Evaluation of Finite Trigonometric Series". The designation Goertzel filter can also be found in the prior art. Both terms relate to the same process. The term filter applies more to the implementation as a block of signal processing, while algorithm refers primarily to the sequence of computing operations taking place in such a block. The implementation may optionally be carried out by means of hardware or software.

The Goertzel algorithm determines a complex coefficient, valid for a selected carrier frequency, of a discrete Fourier transform (DFT), and is therefore often referred to as "DFT for a frequency". The reason for its use is the lower computing outlay compared with DFT when the number of coefficients to be calculated is small. For the measurement of sensor signals according to the type described above, the calculation of a single coefficient is sufficient. The Goertzel algorithm is for this purpose therefore numerically more efficient than the DFT. There are variants of the algorithm, which instead of the complex coefficient determine magnitude and phase or even only one of the two components. These variants differ only in details, and are selected according to the application, i.e. the purpose of the measurement. Both in respect of the prior art and in respect of the invention, the variants may be regarded as one algorithm in terms of all essential features.

Amplitude modulation and the Goertzel algorithm have the disadvantage that they are susceptible to certain perturbation frequencies interfering with the signal frequency or modulation frequency. If, in the frequency band used for the amplitude modulation, there is a strong narrowband perturbation, the frequency and phase of which are unknown, the measurement error caused by this may exceed any limits. An expedient maximum tolerance of the measurement system cannot be specified. The use of amplitude modulation, or the maximum permissible amplitude of perturbations, are limited by this property. Particularly in the application field of safety-relevant automobile components, for example brake systems or steering systems, such failure probability of the sensor signals is unacceptable even if these failures occur only with low probability.

The object of the invention is therefore to provide a method, a signal processing unit or a sensor arrangement, which make it possible with a computing outlay that is as low as possible to implement modulation which is substantially less susceptible to external perturbation frequencies.

BRIEF SUMMARY

The invention is based on the basic concept of, instead of a fixed carrier frequency, carrying out the modulation with a variable carrier frequency and, for the demodulation, using a coefficient which is determined with the aid of the carrier frequencies used. In this way, a spectral distribution of the signal, or useful signal, over the carrier frequencies is achieved. The use of a variable carrier frequency has the advantage that the actual signal, or useful signal, is modulated in different frequencies and therefore the susceptibility to strong perturbation frequencies that corrupt the signals outside permissible tolerance ranges can essentially be excluded. Although the occurrence of the random effects of perturbation frequencies on the signals is increased as a result of this, the extents of the degradation do not represent any problems.

The demodulation in discrete form is carried out with the aid of coefficients which are calculated as a function of the carrier frequencies. The outlay for the demodulation of the sensor signal is increased, in comparison with the already known Goertzel algorithm, only in so far as the coefficients have to be calculated as a function of the carrier frequencies. The coefficients may be calculated beforehand when the carrier frequencies to be used are known. As an alternative, the calculation may be carried out while performing the demodulation. In the former case, there is no difference in terms of the computing outlay compared with the known Goertzel algorithm. Even in the latter case, however, the additional computing outlay can be managed with computation units that are used, for example, in sensors.

The establishment of the carrier frequencies may turn out to be different, depending on requirements. Some possibilities in this regard are described below. The way in which these carrier frequencies are established may remain open. For the demodulation, it is merely necessary that the carrier frequencies used for the modulation are also used as a basis for the calculation of the coefficients.

The demodulation of the modulated signal comprises two phases. In the first phase, the modulated signal is processed, or filtered, by means of the coefficients calculated as a function of the carrier frequencies, and temporarily stored as intermediate values. The process is repeated for a number of sampling steps, the new calculation process being carried out on the basis of the preceding intermediate values. In the second phase, the actual useful signal is then calculated with the aid of coefficient values and intermediate values, which are to be selected. One embodiment thereof will be explained in more detail below. As a result, a value of the signal is obtained. In order to carry out a continuous measurement, for example, the method is to be carried out repeatedly for each signal, or for each signal value.

The method is advantageously refined in that the coefficient is calculated as a function of the instantaneous frequency of the carrier frequencies. The instantaneous frequency corresponds to the carrier frequency currently being used. This ensures that the coefficients are calculated synchronously with the carrier frequency used, and accurate demodulation of the modulated signal is therefore possible.

The method is advantageously refined in that at least one bandwidth of the carrier frequencies is predefined, the bandwidth lying outside predictable perturbation frequencies. If, depending on the application case, particular frequencies have proven particularly susceptible to perturbation, their influence on the useful signal can be reduced further in this way. As an alternative thereto, it is also conceivable to use a bandwidth whilst excluding the known perturbation frequencies, i.e. discontinuous frequency bands.

The method is advantageously refined in that a bandwidth of the carrier frequencies is predefined, the bandwidth being established as a function of a frequency or frequency bandwidth of the signal. The frequency or frequency bandwidth of the signal could also be referred to as a working frequency. This defines the frequencies at which the information of the signal is generated. For the application case of frequency-dependent sensor impedances, the bandwidth would need to be defined in such a way that it is compatible with the working frequencies of the respective sensor impedance. For each application, it is necessary to check the frequency range for which a particularly advantageous transfer function of the overall system is obtained. The effect achieved in this way is, on the one hand, a suppression of the influences of perturbation frequencies which is better the greater the bandwidth, and at the same time it ensures that the demodulation of the signal can be carried out reliably.

The method is advantageously refined in that the signal is modulated by means of a modulation unit, and in that the processing of the modulated signal is carried out by means of a signal processing unit, the carrier frequencies or instantaneous frequencies being synchronized between the modulation unit and the signal processing unit. In closed systems, simple and reliable transfer or transmission of the carrier frequencies or instantaneous frequencies to the signal processing unit can be carried out in this way, in order to ensure correct demodulation of the signal.

The method is advantageously refined in that the values of the coefficient or coefficients are calculated before the modulation of the signal, in particular fully for all carrier frequencies. In this way, the additional computing outlay for calculation of the coefficients can be placed upstream of the method. To this end, however, it is necessary that the carrier frequencies to be used are known.

The method is advantageously refined in that the values of the coefficient are stored in a nonvolatile memory. The coefficients then only need to be called up from the memory, and therefore do not require any additional calculation.

The method is advantageously refined in that the coefficients are calculated by means of the equation $$c(n)=2\cos(2\pi * f\_signal(n)/f\_sample).$$

The definitions of the individual terms of the equation are as follows:
n=sampling step
c(n)=coefficient for the sampling step n
f_signal(n)=carrier frequency or instantaneous frequency for the $n^{th}$ sampling step
f_sample=sampling frequency.

For each sampling step n, a value of the coefficient c is calculated with the aid of the equation and is used as a basis for the demodulation. It is in this case essential that the respective carrier frequency or instantaneous frequency is used as a basis for each coefficient.

The method is advantageously refined in that the intermediate values are calculated by means of the following procedure, which is represented in the form of a pseudo-code:

$s1=0$ $s2=0$ repeat with n from 1 to n_max $s=\text{signal}(n)+c(n)*s1-s2$ $s2=s1$ $s1=s$ end.

The definitions of the individual terms in the procedure are as follows:
s, s1, s2=intermediate values of different sampling steps
signal(n)=modulated signal value in step n
n_max=total number of sampling steps for a procedure.

The intermediate values s, s1 and s2 represent the intermediate values of the current sampling value n, or of the preceding sampling steps n-1 and n-2. By means of the calculation of the intermediate values for the sampling steps 1 . . . n_max, filtering of the modulated signal is carried out with the aid of the adapted coefficient c(n), which may then be used to calculate the desired signal.

Preferably, the method according to the invention is refined in that an amplitude of the signal A is calculated by means of the equation $$A=2*\text{sqrt}(s2*s2+s1*s1-c(n\_max)*s1*s2)/n\_max.$$

For the calculation of the amplitude of the signal A, it has been found advantageous to use the value of the coefficient in the last sampling step n_max. It is, however, conceivable to use other coefficient values.

The method is advantageously refined in that the modulation of the signal is carried out by using precalculated values of the coefficient. Both the modulation and the demodulation are then carried out on the basis of the coefficients. The values of the coefficients may respectively be calculated beforehand for the number of sampling values. In this way, synchronization between the modulation unit and the signal processing unit can be achieved in a particularly straightforward way.

It is in this case particularly advantageous to carry out the aforementioned method by means of an inverse procedure of the method according to the invention, which proceeds as follows:

$s1=0$ $s2=\sin(2\pi * f\_signal/f\_sample)$ repeat with n from 1 to n_max $s=c(n)*s1-s2$ $s2=s1$ $s1=s$ $\text{signal}(n)=s$ end.

The invention is furthermore achieved according to a second aspect of the invention by means of a signal processing unit as claimed in the second independent main claim.

The object of the invention is furthermore achieved according to a third aspect of the invention by means of a sensor arrangement having the features according to the third independent main claim.

BRIEF DESCRIPTION OF THE DRAWINGS

Other advantages of the disclosed subject matter will be readily appreciated, as the same becomes better understood by reference to the following detailed description when considered in connection with the accompanying drawings wherein.

DETAILED DESCRIPTION

Referring to the Figures, wherein like numerals indicate like parts throughout the several views, a sensor arrangement 1 is shown and described herein.

Figure 1:
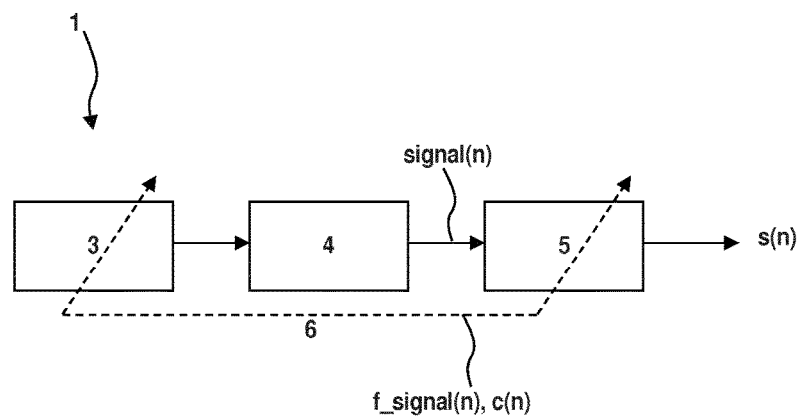
FIG. 1 shows an exemplary embodiment of a sensor arrangement according to the invention.

FIG. 1 shows the schematic structure of the sensor arrangement 1, which may be integrated into known sensors. The sensor arrangement 1 comprises a modulation unit 3 for modulating a signal, or a sensor signal. The sensor signal is generated by means of a sensor element 4. The invention may be carried out with different types of sensor elements, for example ohmic resistances, capacitances or inductances. A signal processing unit 5 demodulates the modulated signal signal(n) or carries out a part of the demodulation according to the method according to the invention. The modulation unit 3 and the signal processing unit 5 are connected to one another via a connection 6 so that synchronization of the carrier frequency, instantaneous frequency f_signal(n) or of the coefficients c is possible by means of this.

The modulation unit 3 generates a carrier signal having a carrier frequency, or within a selected frequency bandwidth. The signal is applied to the sensor after having been converted by means of a digital/analog converter (not shown in the figures). It is also conceivable to configure the modulation unit as an analog oscillator. On the part of the signal processing unit, the analog signal is again converted by means of an analog/digital converter.

Figure 2:
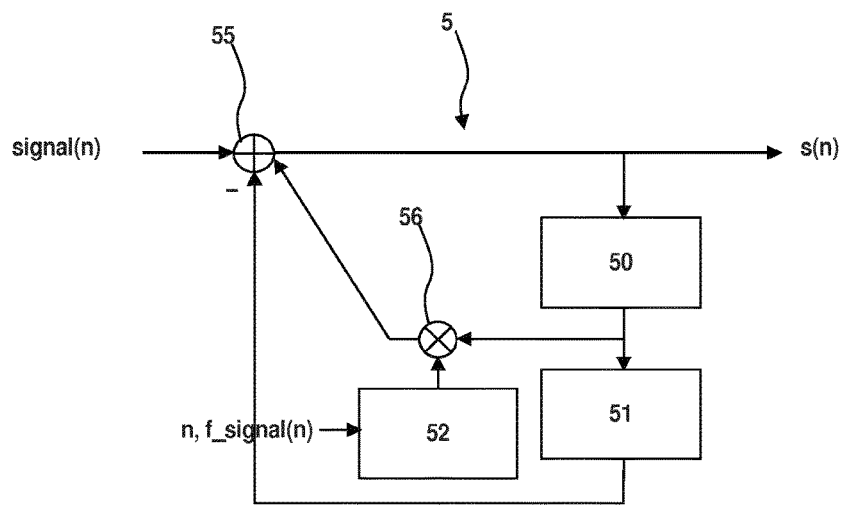
FIG. 2 shows an exemplary embodiment of a signal processing unit according to the invention.

FIG. 2 schematically represents an exemplary embodiment of the signal processing unit 5. The modulated sensor signal is fed in through the input of the signal processing unit 5. The signal processing unit 5 processes the modulated input signal over a plurality of iterations corresponding to a number of sampling steps.

The signal processing unit 5 comprises two intermediate memories 50, 51. The intermediate values of different sampling steps n-1 and n-2 are stored in the intermediate memories 50, 51. The intermediate memory 50 is connected, on the one hand, via a multiplier 56 to a coefficient block 52 in which the different values of the coefficient c(n) are stored. The value of the intermediate memory 50 is multiplied by the respective $n^{th}$ coefficient value c(n) and added to the input signal. Furthermore, the intermediate memory 50 is connected to the second intermediate memory 51. The preceding intermediate value of the first intermediate memory (s2, or s(n-2)) is stored in the second intermediate memory. The value from the second intermediate memory 51 is subtracted from the input signal signal(n). On the input side, the first intermediate memory is connected to the output of the summation element 55. After each cycle, the result of the summation element 55 is stored in the first intermediate memory 50. This value corresponds to the output value of the signal processing unit 5.

A plurality of variants are provided for implementation of the coefficient block 52. On the one hand, the coefficient block may be configured as a simple memory in which the values of the coefficient which are to be used are stored. In particular, this variant is advantageous when the frequencies to be used, or the frequency band to be used, for modulation of the signal is fixed or known. It is in this case advantageous to select the frequencies, or the frequency band, in such a way that it does not cover the known perturbation frequencies. The calculation of the coefficients is preferably carried out by means of the equation $$c(n)=2\cos(2\pi \cdot f\_signal(n)/f\_sample),$$

where
n=sampling step
c(n)=coefficient for the sampling step n
f_signal(n)=carrier frequency or instantaneous frequency for the $n^{th}$ sampling step
f_sample=sampling frequency.

As an alternative thereto, it is possible to configure the coefficient block 52 as a computation unit, in which the values of the coefficient c(n) are calculated continuously according to the input value for the instantaneous frequency or carrier frequency f_signal(n) for each sampling step n.

The signal processing unit 5 may, as described above, be configured in terms of circuit technology in order to carry out the calculation of the intermediate steps according to the following procedure. As an alternative, however, it is also possible to configure the signal processing unit 5 as a programmable circuit and to embody the procedure by means of corresponding programming of the software. The procedure for calculating the intermediate values is carried out in the following steps:

$$s1=0$$

$$s2=0$$

repeat with n from 1 to n_max $$s=\text{signal}(n)+c(n)\cdot s1-s2$$

$$s2=s1$$

$$s1=s$$

end.

The procedure is essentially a loop, which is cycled through for the total number of sampling steps n_max.

As an initial condition, two intermediate values s1 and s2 are predefined with the values zero. A further intermediate value s is defined for the loop, the intermediate value being defined according to the equation indicated above. The term signal(n) corresponds to the modulated signal in the sampling step n, which is present here in discrete form.

The calculation of the amplitude of the signal, or of the useful signal, is carried out by means of the equation $$A=2\cdot\text{sqrt}(s2\cdot s2+s1-c(n\_max)\cdot s1\cdot s2)/n\_max.$$

The overall procedure comprising the calculation of the coefficient c(n), of the intermediate values s, s1, s2 and of the signal A is in each case carried out for the demodulation of a signal value. In the case of a continuous measurement, for example in the case of a sensor, the overall procedure is to be carried out for each value determined and modulated by the sensor. Since the measurement rate or a measurement cycle of a sensor lies in the range of a few milliseconds, it is advantageous to calculate the coefficients beforehand.

Advantageously, the modulation of the signal is carried out by means of the following procedure in order to achieve synchronization of the carrier frequency or instantaneous frequency between the modulation unit and the signal processing unit. The nomenclature of the terms corresponds to the definitions indicated above.

$s1=0$ $s2=\sin(2\pi * f\_signal/f\_sample)$ repeat with n from 1 to n_max $s=c(n)*s1-s2$ $s2=s1$ $s1=s$ $signal(n)=s$ end.

Figure 3:
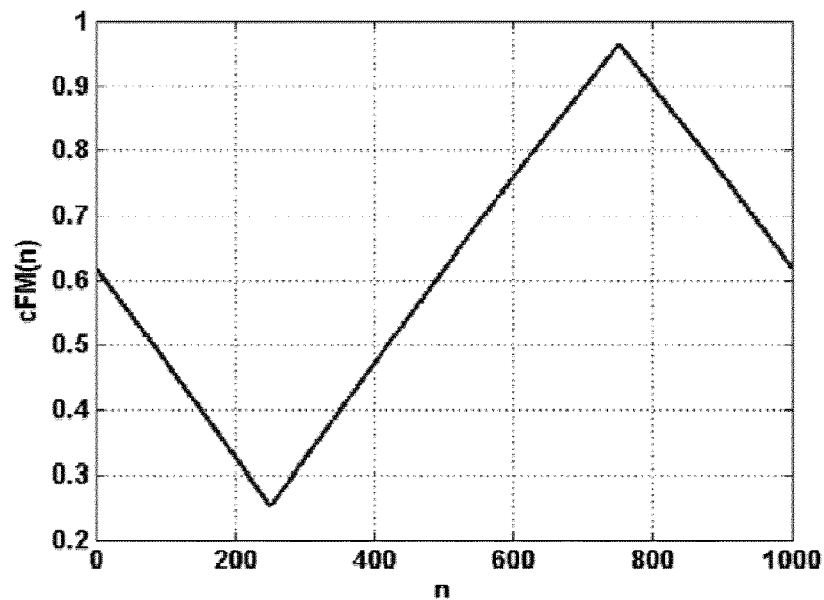
FIG. 3 shows a profile of the values of the coefficients c.
Figure 4:
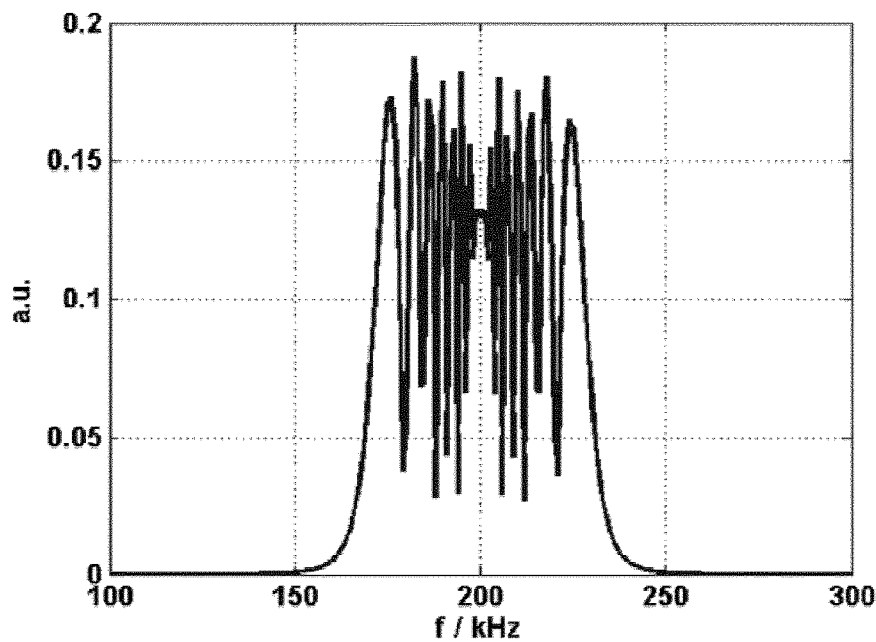
FIG. 4 shows a profile of the amplitude spectrum according to the values of the coefficient in FIG. 3.
Figure 5:
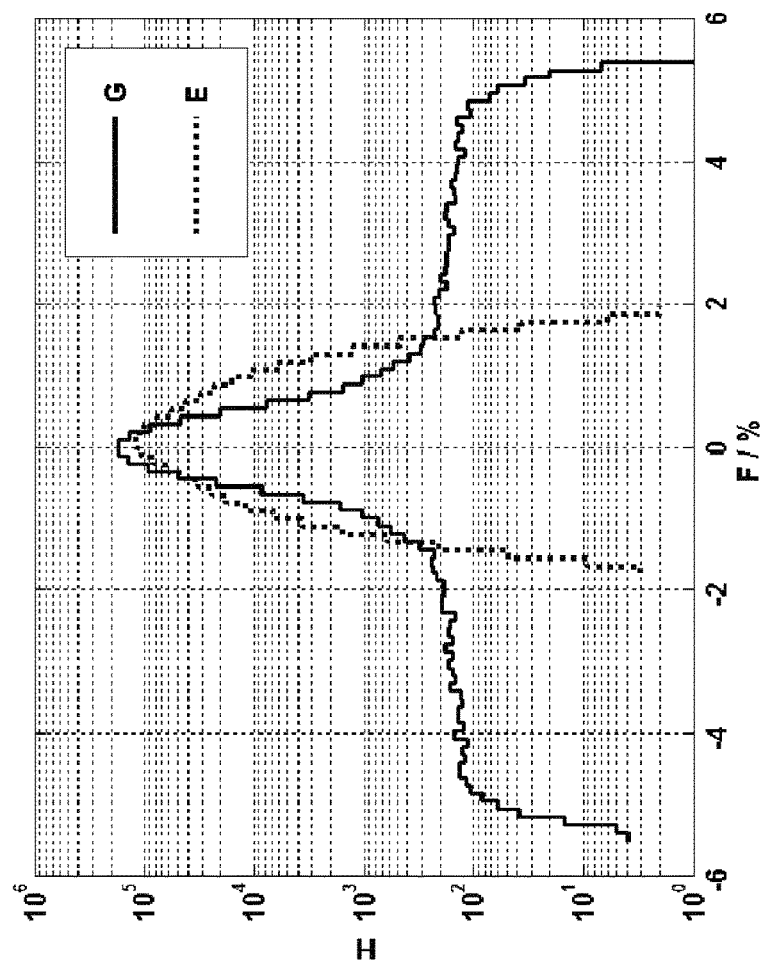
FIG. 5 shows a comparison of the perturbation susceptibility of the method according to the invention in relation to the Goertzel algorithm from the prior art.

A simulation was carried out with the method according to the invention. Some visualizations of the simulation are shown in FIGS. 3 and 4. FIG. 5 shows a comparison of the deviations of the demodulated signal according to the method according to the invention and according to the already known Goertzel algorithm.

A sampling rate of 1 MHz (A/D and D/A converters) and a measurement cycle of 1 ms were selected for the simulation. The total number of sampling steps is n_max=1 MHz*1 ms=1000 sampling steps per measurement cycle. The frequency of the amplitude-modulated carrier and the central frequency of the variable carrier are selected around 200 kHz. The Goertzel coefficient for the conventional solution is cAM=0.6180. For the solution according to the invention, the instantaneous frequency should oscillate around the central frequency, and the average value of the coefficient field cFM(1 . . . nmax) is therefore likewise cAM. This formally corresponds to frequency modulation.

For the simulation, a curve shape was selected for the coefficient and the carrier signal was established as a function of the curve shape of the coefficients. A triangular oscillation was selected as the curve shape for the frequency modulation, because this oscillation leads to a uniform spectral density of the resulting oscillation. When using a sinusoidal oscillation, the instantaneous frequencies at the ends of the spectrum used would be more frequent than those in the middle, while equidistribution can be achieved inter alia with the triangular shape. The triangular shape is in no way a prerequisite for the solution according to the invention, although uniform use of the spectrum used is always to be regarded as advantageous when there is no information about the system (application system, transmission medium, expected perturbations, etc.) leading to different metrological use of different frequencies in the spectrum used. The values of the coefficient field cFM(1 . . . nmax) may be selected freely, and the amplitude of the triangular shape is therefore also freely selectable. Higher amplitudes lead to the use of a broader spectrum. For the reasons discussed above, it is necessary to carry out an appraisal between the advantages and disadvantages of a broadband configuration. The compromise selected for this exemplary embodiment is graphically represented in FIG. 3. The cFM values as a function of the index n can be found in the figure. The associated amplitude spectrum is shown in FIG. 4. The choice of the coefficient field therefore leads to approximately uniform use of a band of about 60 kHz at 200±30 kHz.

The coefficient field is now used in order to determine the sample values of the excitation function with the aid of the inverse Goertzel algorithm. The result is stored and the values are sent successively to a D/A converter. When the end of the field is reached (which is equivalent to the end of the measurement cycle), in the case of continuous operation of the system a start is made again at the beginning of the field. The excitation signal is sent to the sensor via an amplifier. For example, a current may be given to the sensor as excitation and a voltage may be tapped from the sensor, or a voltage may be applied and the current may be measured. The signal modulated by the sensor is sent to an A/D converter. A Goertzel filter is then implemented with the samples by using the same coefficient field. If the same coefficient (i.e. the one with the same index) is used for each step (A/D and D/A), then the two parts are synchronized in terms of their instantaneous frequency, as represented in FIG. 1.

Compared with conventional AM with sinusoidal excitation, only the memory and the indexing are to be listed as additional outlay. The requirement of achieving a reduction of the perturbations with low circuit outlay is therefore satisfied.

The advantage may be shown by carrying out calculation of the signal processing steps in a Monte Carlo simulation. To this end, in each cycle, a perturbation that is determined by a random generator is added to the signal of the sensor. In the present case, the perturbation is the sum of white noise (broadband) and a sinusoidal signal (narrowband), the phase and frequency of which (between 150 and 250 kHz) are random. This signal has an amplitude which is 5% of the amplitude of the sensor signal. The noise has an equally large RMS value. After $10^6$ cycles, the frequency distribution of the error (i.e. the deviation from the sensor signal) of FIG. 5 is obtained.

Although the solution E according to the invention numerically has a higher number of deviations in the range of up to ±2%, the number of deviation tends toward zero in the range above ±2%.

The Goertzel algorithm G known from the prior art also has a low number of deviations above ±2%. The deviations range up to about ±6%. For the application in measurement technology, this is a substantial disadvantage in comparison with the method according to the invention. The invention is not however restricted to application in sensors, even though this application field is particularly advantageous.

The invention claimed is:

1. A method for processing a signal modulated with a variable carrier frequency, comprising:
    calculating a coefficient (c(n)) for demodulation of the signal,
    demodulating the signal by calculating discrete intermediate values (s, s1, s2) utilizing the coefficient for a predefined maximum number of steps (n_max), and
    calculating the signal with the aid of the intermediate values and the coefficient (c(n)),
    wherein the value of the coefficient (c(n)) is respectively calculated on the basis of carrier frequencies (f_signal (n)) for each sampling step from a first step to the predefined maximum number of steps (n_max), and
    wherein the modulation of the signal is carried out by using precalculated values of the coefficient and calculated utilizing the following procedure $s1=0$ $s2=\sin(2\pi f\_signal/f\_sample)$ repeat with n from 1 to n_max $s=c(n)*s1-s2$ $s2=s1$ $s1=s$ $signal(n)=s$ end wherein f_signal is the carrier frequency or instantaneous frequency for the nth sampling step, and f_sample is a sampling frequency.

2. The method as set forth in claim 1, wherein the coefficient is calculated as a function of the instantaneous frequency (f_signal(n)) of the carrier frequencies.

3. The method as set forth in claim 1, wherein at least one bandwidth of the carrier frequencies is predefined, the bandwidth lying outside predictable perturbation frequencies.

4. The method as set forth in claim 2, wherein a bandwidth of the carrier frequencies is predefined, the bandwidth being established as a function of a frequency or frequency bandwidth of the signal.

5. The method as set forth in claim 1, wherein the signal is modulated with a modulation unit, and in that the processing of the modulated signal is carried out with a signal processing unit, the carrier frequencies or instantaneous frequencies being synchronized between the modulation unit and the signal processing unit.

6. The method as set forth in claim 1, further comprising storage of the values of the coefficient in a nonvolatile memory.

7. The method as set forth in claim 1, further comprising storage of identical coefficient values in a memory location.

8. The method as set forth in claim 1, wherein the coefficients are calculated utilizing the equation $c(n)=2\ \cos(2\pi \cdot f\_signal(n)/f\_sample)$, where n=sampling step
c(n)=coefficient for the sampling step n
f_signal(n)=carrier frequency or instantaneous frequency for the nth sampling step
f_sample=sampling frequency.

9. The method as set forth in claim 1, wherein the intermediate values are calculated by utilizing the following procedure $s1=0$ $s2=0$ repeat with n from 1 to n_max $s=\text{signal}(n)+c(n)*s1-s2$ $s2=s1$ $s1=s$ end, where
s, s1, s2=intermediate values of different sampling steps
signal(n)=modulated signal value in step n
n_max=total number of sampling steps for a procedure.

10. The method as set forth in claim 1, wherein an amplitude of the signal is calculated utilizing the equation $A=2*\text{sqrt}(s2*s2+s1*s1-c(n\_\text{max})*s1*s2)/n\_\text{max}$, where:

s1, s2=intermediate values after n_max steps
c(n_max)=coefficient value at step n_max.

11. A sensor arrangement, comprising:
a modulation unit for modulating a sensor signal, wherein the modulation of the signal is carried out by using precalculated values of a coefficient and calculated utilizing the following procedure $s1=0$ $s2=\sin(2\pi \cdot f\_signal/f\_sample)$ repeat with n from 1 to n_max $s=c(n)*s1-s2$ $s2=s1$ $s1=s$ signal(n)=s end,
wherein f_signal is a carrier frequency or instantaneous frequency for the nth sampling step, and f_sample is a sampling frequency,
a sensor element for generating the sensor signal, and
a signal processing unit comprising
a coefficient block configured to continuously calculate a plurality of values of the coefficient (c(n)) for demodulating the signal,
a summation element configured to demodulate the signal by calculating discrete intermediate values using the coefficient (c(n)) for a predefined maximum number of steps (n_max) and calculating the signal with the aid of the intermediate values and the coefficient (c(n)),
at least one intermediate memory for storing the intermediate values, one of the intermediate memories being connected to the coefficient block, and
a multiplier for multiplying one discrete intermediate value by the coefficient (c(n)) to generate a sum, the sum being deliverable to the summation element.

\* \* \* \* \*